United States Patent
Shvartsman et al.

(10) Patent No.: US 7,742,273 B1
(45) Date of Patent: Jun. 22, 2010

(54) SELF-PROTECTED, INTELLIGENT, POWER CONTROL MODULE

(76) Inventors: Vladimir A. Shvartsman, 7331 Intermodal Dr., Louisville, KY (US) 40258; Yuriy Ivanyuk, 4528 Oak Pointe Dr., Louisville, KY (US) 40245

(*) Notice: Subject to any disclaimer, the term of this patent is extended or adjusted under 35 U.S.C. 154(b) by 653 days.

(21) Appl. No.: 11/496,362

(22) Filed: Jul. 31, 2006

(51) Int. Cl.
*H01H 9/00* (2006.01)

(52) U.S. Cl. .................. 361/160; 361/103; 307/10.1

(58) Field of Classification Search ............. 361/103, 361/160–166, 170, 191, 195; 307/10.1
See application file for complete search history.

(56) References Cited

U.S. PATENT DOCUMENTS

| | | | | |
|---|---|---|---|---|
| 3,859,540 | A | * | 1/1975 | Weiner .................. 290/38 R |
| 3,882,452 | A | * | 5/1975 | Stevens .................. 340/425.5 |
| 4,291,357 | A | | 9/1981 | Hong .................. 361/101 |
| 4,291,367 | A | | 9/1981 | Haas .................. 363/21 |
| 4,446,460 | A | * | 5/1984 | Tholl et al. .................. 340/825.69 |
| 5,528,446 | A | * | 6/1996 | Sankaran et al. .................. 361/25 |
| 5,811,888 | A | * | 9/1998 | Hsieh .................. 307/10.8 |
| 6,433,978 | B1 | | 8/2002 | Neiger et al. .................. 361/42 |
| 6,466,060 | B2 | | 10/2002 | Lee .................. 327/108 |
| 6,520,279 | B2 | | 2/2003 | Fukumoto et al. .................. 180/446 |
| 6,777,944 | B2 | * | 8/2004 | Kim et al. .................. 324/426 |
| 6,870,458 | B2 | * | 3/2005 | Caren .................. 340/5.22 |
| 6,934,139 | B2 | * | 8/2005 | Kumagai et al. .................. 361/103 |
| 7,265,959 | B2 | * | 9/2007 | Guo .................. 361/93.1 |
| 7,304,828 | B1 | | 12/2007 | Shvartsman | |

(Continued)

OTHER PUBLICATIONS

X-Ref Related U.S. Appl. No. 10/946,841, Sep. 22, 2004.

(Continued)

*Primary Examiner*—Jared J Fureman
*Assistant Examiner*—Christopher J Clark
(74) *Attorney, Agent, or Firm*—Clifford Kraft

(57) ABSTRACT

An intelligent, self-protected control module which is a fully protected and configured as a multi-terminal device controlling a number of power field-effect transistors for delivering power to loads. The device can contain a central processing unit or logic, precision Hall-Effect based current sensors for precise measuring of bypass currents, temperature sensors, and input/output circuitry as well as an optional RF receiver. The inputs can incorporate de-bouncing techniques to prevent false turn on/off. Inputs can provide command signals for the processor or logic with built-in watchdog circuitry to monitor the input power supply. The CPU or logic can provide communications with external devices, generate alarms, generate control signals to turn-on/turn-off power MOSFETs, and analyze currents and temperature of each channel. Unlike an electromechanical relay, the present invention is free from arcing and sparking, there are no contact materials to wear, and it is noiseless. The present invention provides over-current protection by shutting down a troubled channel if it is overloaded. It provides protection to the load by limiting the bypass current to the preset value, or shutting the channel off in a case of over-current. The present invention provides over-temperature protection by shutting down an appropriate channel if any of the MOSFET's temperature reaches a predetermined value. The present invention can generate an output signal that is capable of driving an external indicator lamp if a problem has occurred. An optional RF receiver designed to receive a coded signal from a key-chain transmitter can provide a method of enabling the module to accept a control signal from the input remotely.

4 Claims, 7 Drawing Sheets

U.S. PATENT DOCUMENTS

| | | | |
|---|---|---|---|
| 7,319,298 B2 * | 1/2008 | Jungwirth et al. | 315/307 |
| 2003/0095367 A1 | 5/2003 | Mares et al. | 361/93.7 |
| 2005/0168072 A1 * | 8/2005 | Saito et al. | 307/10.1 |
| 2007/0024124 A1 | 2/2007 | Zalmanoff | 307/116 |

OTHER PUBLICATIONS

X-Ref Copending U.S. Appl. No. 10/946,841, Same Inventor (Shvartsman).

\* cited by examiner

SELF-PROTECTED, INTELLIGENT, POWER CONTROL MODULE

BACKGROUND

1. Field of the Invention

The present invention relates generally to electric power control and more specifically to self-protected, intelligent power control module. The present invention, in specific embodiments, can be used as a power control center for a vehicle such as a motorcycle, automobile, boat or airplane and many industrial and defense applications where protection of a load is essential.

2. Description of the Prior Art

For years, electromechanical relays have been used in a wide variety of power control and other electrical applications. These mechanical devices, which are built of a coil and contacts, have demonstrated considerable reliability; however, they suffer from numerous problems associated with having moving parts. In particular, mechanical relays are subject to arching and sparking. In applications where it is required to switch a high DC voltage, the cost of a mechanical relay grows very rapidly. The switching of the coil leads to destructive voltage spikes (a fly-back voltage), while considerable power is needed to activate the coil (sometimes ten watts or more). In addition, material fatigue can shorten the life of a mechanical relay, and reliability can suffer from shock and vibration. An average electromagnetic relay is normally related for around 900,000 cycles. A solid state relay, on the other hand, can perform 5,000,000 cycles in several hours. These types of mechanical issues can be of major concern when the relay is used in harsh environments. For example, many vehicles, such as cars, tractor/trailers, heavy vehicles and aircraft typically use numerous relays in their various systems. Many such relays are also exposed to environmental corrosive substances (liquids, gases and the like). These substances can cause mechanical corrosion that can lead to breakdown. Another severe problem with mechanical devices like relays is that they have only and abrupt on or off transition. This introduces additional large transitional spikes. Solid state devices, on the other hand, can be designed to make timed off and on transitions.

Modern solid state power devices can be built with internal protection using field effect transistors with integrated current and temperature sensing. This allows building self-protective power devices with low voltage field effect transistors. In the past, a low value series resistor was inserted in series with the load (or bypassing a portion of load current) to allow current measurement. However, the extra heat generated by the resistor can create a problem. In addition, the addition of the resistor increases the overall resistance of the channel thereby lowering efficiency. It would be advantageous to eliminate this resistor.

In many power applications, a fuse is a common safety device that protects the power source and the connective conductors in the case of a problem with the load. If the load suddenly starts to consume excessive power, it is well known in the art that the fuse is designed to burn out and break the circuit thus removing voltage from the load and preventing further current flow preventing further damage and any fire hazard. Quite often, it is not an easy task to select the proper fuse. Many times, initial (turn-on) transient current draw from a load is much higher than normal operation load current. This can be countered by either using a fuse with a much higher than needed rating or by using a device known as a slow-blow fuse. A slow-blow fuse times before blowing. These fuses generally cost more than regular fuses. The fuse itself, has no built-in protection and will generally be damaged from a spike or current draw higher than it's rating that lasts too long. It would be advantageous to have a power control module that presents a combination of a protective device with characteristics of a slow-blow fuse with the additional feature of turn-off when current exceeds a particular value for a particular time. This power control module could withstand higher surge currents and avoid damage by excessive current. This power control module should also minimize false disconnection.

An Inherent problem with a fuse is an un-restorable power disconnection due to an overload. A burned fuse must be replaced, and that takes a time and human involvement. The result is lost production time and/or increase costs. In some cases, when a spare fuse is not available, the replacement made from any available and untested conductor. This dangerous practice can result in substantial danger and/or damage. Some of the newer semiconductors and electronic fuses have somewhat improved reliability by temporarily disconnecting of current flow during overload. However, some of them only withstand several trips, and none of them inform of a problem with a load.

SUMMARY OF THE INVENTION

The self-protected, intelligent power control module of the present invention can be integrated into a single package and can generally exhibit a low output terminal resistance equal to the Rds (on) of a powerful MOSFET device which is around 16 milliohms. In addition, the device can have internal protection and control circuitry. The device should be rugged, efficient, corrosion resistant and compact and can be used in military, industrial, consumer and automotive applications in harsh environments. The present invention can include protection features such as over-temperature, under-voltage and over-current protection. In addition, the invention should be able to handle open loads and short circuits at the output as well as excessive ambient conditions such as temperature and humidity. The protective fusing of the present invention should be self-healing and automatically restore the circuit to normal working condition as soon as the problem is removed.

The present invention remedies many of the problems associated with electromechanical relays by providing a solid-state control which is better equipped to protect a load compared to prior art relays and sold-state controls. The present invention is particularly well-suited for applications with high inrush current. It can be used as a power control switch with resistive, capacitive and inductive loads. It works well for the initial excess current of incandescent lamps, solenoids and many other applications. By replacing relays and fuses with a small amount of discrete circuitry, an efficient power control module can be achieved that is compact and uses very little space. It thus becomes an efficient replacement for electromagnetic relays, solid-state relays, breakers and fuses.

The following are objects of the invention:
  An intelligent, self-protected power control module with FETs installed in each channel and control circuitry that can process external and internal information to control the FETs. Control circuitry that controls whether the device appears as a closed or open state by controlling whether the FETs are in the on or off state, where the control circuitry can be further made up of input/output circuitry, a central processor, drivers, FETs, integrated Hall-Effect based current sensors, integrated temperature sensors, an under-voltage detector, and an RF receiver.

A power controller where FETs can be added to make a double, triple or n-FET device to meet the maximum current requirements; the number of channels can be adjusted to meet application requirements.

A power controller that uses various data collection techniques for measuring currents that can then control over-temperature shutdown circuitry. The measurement of current can use an integrated Hall-Effect current sensing device and a precision comparator (threshold detector), where the Hall effect current sensor measures the applied current flowing by using the generated magnetic field. This is sensed and applied to a precision comparator.

A power controller where the over-temperature includes a temperature sensor situated in close proximity to an FET, where the temperature sensor detects the temperature of the FET near or inside the FET.

A power controller where the FETs generally contain integrated current sensing, over current and over temperature protection for each individual channel. A CPU or other logic can combine alarm signals, turn off a corresponding channel, and change the state of an alarm-out terminal.

A power controller with a resetable time-delay tripable by signal from a sensor. Once the time-delay is activated it can continue until expiration and then turn off the appropriate channel, or it can be reset if the sensor is turned to a normal condition.

A power controller where the time delay protection includes a digital counter/timer where said the timer starts counting once the sensor is activated, and is reset when the sensor has changed it status back to normal.

A power controller also containing over temperature detection circuitry.

A power controller having a housing potted with a highly thermally conductive Epoxy Resin to increase the effective a heat dissipation area in many times.

A power controller which is a fully protected device requiring no additional protection such as a fuse. The load also does not require a fuse (however an optional single fuse is recommended).

A power controller which provides information about a problem with one or all loads thus aiding safety. An operator can be informed that one or more loads are bad and need to be replaced.

Figure 1A:
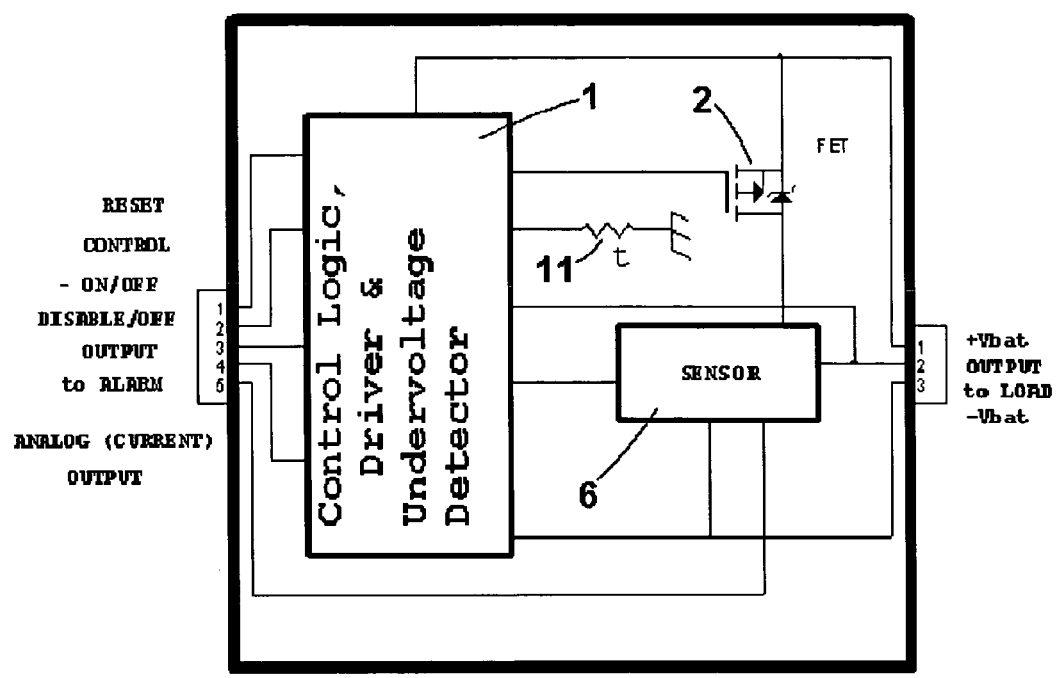
FIG. 1A shows a block diagrams of one channel of an embodiment a solid-state self-protective relay of the present invention.

Several drawings have been presented to better illustrate the concepts of the present invention; the scope of the present invention is not limited to the embodiments shown in the drawings.

DESCRIPTION OF THE INVENTION

The power control module of the present invention is designed around several solid state self-protective relays (SSSPR), and embodiment of one of them is shown in FIG. 1A. The SSSPR consist of three major parts: a power MOSFET 2, a Hall-Effect or other current sensor with amplifiers 6, and a control logic 1. The control logic 1, processes various inputs and outputs such as reset, on/off, alarms, and possibly an analog current output. The sensor 6, is preferred to be a Hall-Effect sensor that can produce an output proportional to the magnetic field produced by the load current (or portion of the load current) flowing through it. This output can be fed back to the control logic 1 to provide over-current regulation and emergency shut-down. A thermal sensor 11 can directly sense the temperature of the MOSFET 2 and provide this information to the logic circuit 1. An over-temperature condition can cause a shutdown. The device of FIG. 1A can have an external reset, a disable control, an alarm output, and an analog output voltage indicative of load current. The module of FIG. 1A is shown with input and output plugs; however, any other type of connections are within the scope of the invention.

Figure 1B:
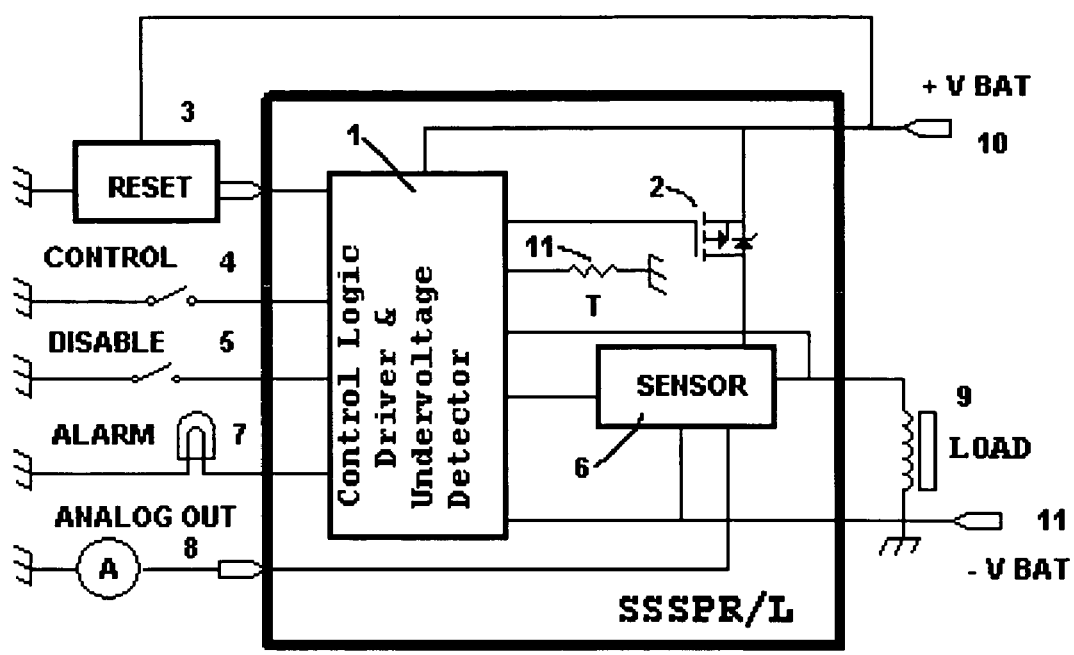
FIG. 1B shows a possible application of the relay from FIG. 1A with external devices.

FIG. 1B shows a possible application of the SSSPR of FIG. 1A. The SSSPR connections to input and output devices Various input/output devices like a control button 4, an alarm light or a siren 7, a Oil Pressure Sensor that can be tied into a disable input 5 and a ampere-meter 8 using the analog output. Other inputs such as a micro-switch, an RF Receiver etc. can control/trigger the SSSPR in such manner that it delivers power from a battery (+Vbat) that will applied to a load in a controlled and safe manner. Any type or number of inputs are within the scope of the present invention.

Figure 2:
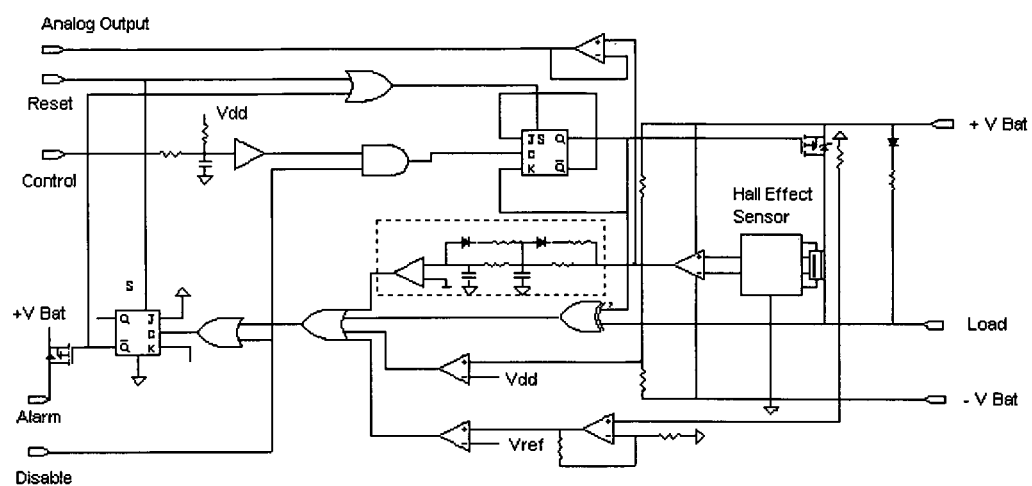
FIG. 2 shows a schematic of a latching solid state self-protective relay.

There are generally two types of SSSPRs that form the basic controllers of the present invention; one is a latching (SSSPR/L) type device, and the other is an instantaneous (SSSPR/I) type device. FIG. 2 shows a latching type SSSPR/L device. The SSSPR/L can be built using common components. Its input (control) and output (output to a load) relationship is straightforward with a single control so that the output state will change from on to off or vice-versa. The device will remain in a particular state until a new control signal changes it. The SSSPR/L can be turned off or disabled via the RESET/OFF input shown in FIG. 2. The logic part of the SSSPR can be designed and built on a single programmable logic (PAL) chip, discrete logic or a single chip microcontroller that would replace most of the discrete components.

In FIG. 2, once, the +Vbat and −Vbat of the SSSPR are connected to a power source (battery, power supply, etc.), three actions normally occur. A reset pulse is generated and turns both flip-flops to a starting or reset state. In addition, if current flows through the hall-sensor and hence the load, than an exclusive OR gate sends a signal to the clock input of the flip-flop via an OR gate (if a load is present). If there is no load, the gate generates a signal that will disable (reset) the flip-flop. At the same time, a watchdog designed around a comparator compares the power supply voltage (Vbat) with the reference (Vdd). If the power supply is less than the Vdd a signal is generated that will disable the flip-flop. If all three tests passed, the SSSPR is ready for the task of supplying power to the load. To activate the SSSPR, the terminal CONTROL which is normally high (logical 1) is brought low by a push-button, a switch or a control signal from another device connected to the CONTROL and the −Vbat. This action will change the state of the flip-flop, and the Q output of it will go low. A low voltage is then applied to the gate of a powerful MOSFET (FET) which applies +Vbat to a load.

Once the MOSFET is activated, current flows from −Vbat to the load, and a conductive bypass of the Hall Sensor, to the +Vbat. The Hall sensor (or other current sensor) measures the magnetic field generated by the bypass current (or measures the current some other way). The magnetic field is converted by the Hall device into a voltage. An additional amplifier applies voltage to an emitter follow (also a MOSFET) which provides a real-time current flow to an external devices such as an ampere-meter, a recording device, etc. The signal is also applied to an integrator/averaging/threshold network. This network sets a condition that simulates a time-delay fuse. It averages all short pulses that represent transient spikes. The resulting voltage is applied to a comparator and compared with a reference voltage. If the current exceeds a preset level, or the corresponding voltage equal to or larger than the reference voltage, the comparator generates a signal that will reset the flip-flop and turn-off the power MOSFET. In addition, the MOSFET will be turned off if a thermistor in combination with an amplifier, and a comparator detects an over-temperature condition. The output FET can drive an alarm lamp that indicates that there is a problem with the SSSPR/L.

Figure 3:
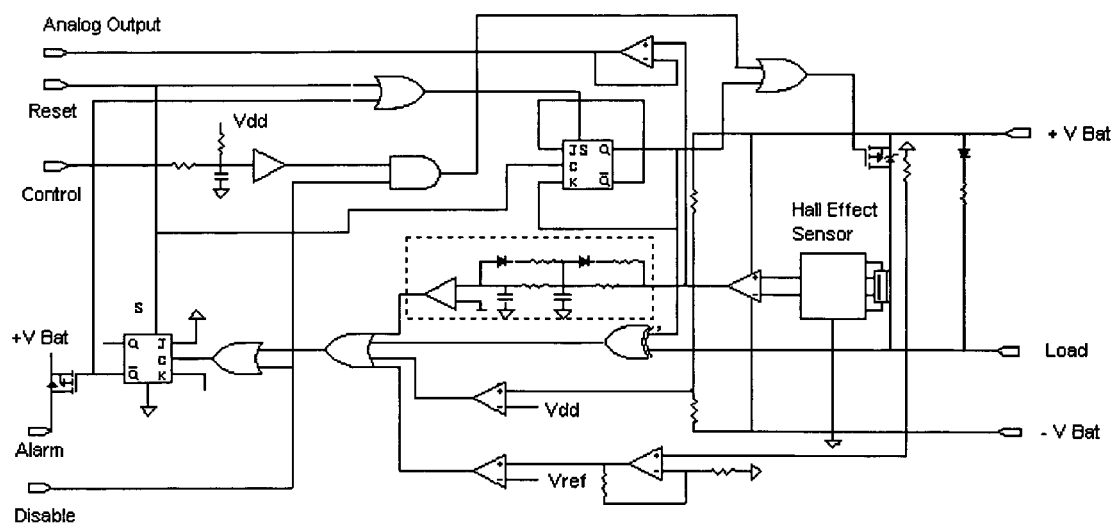
FIG. 3 shows schematic of an instantaneous solid state self-protective relay.

FIG. 3 shows a schematic of an SSSPR/I instantaneous device. It is very much similar to the SSSPR/L except the CONTROL-ON/OFF will turn-on the power MOSFET and keep it on long as the control signal is present. The control will work as long as there is no current overload, no over-temperature, no problem with a load and no command from the DISABLE/OFF input. The instantaneous control of the output MOSFET is achieved in this example with an extra OR GATE (shown in the upper right of FIG. 3).

Figure 4:
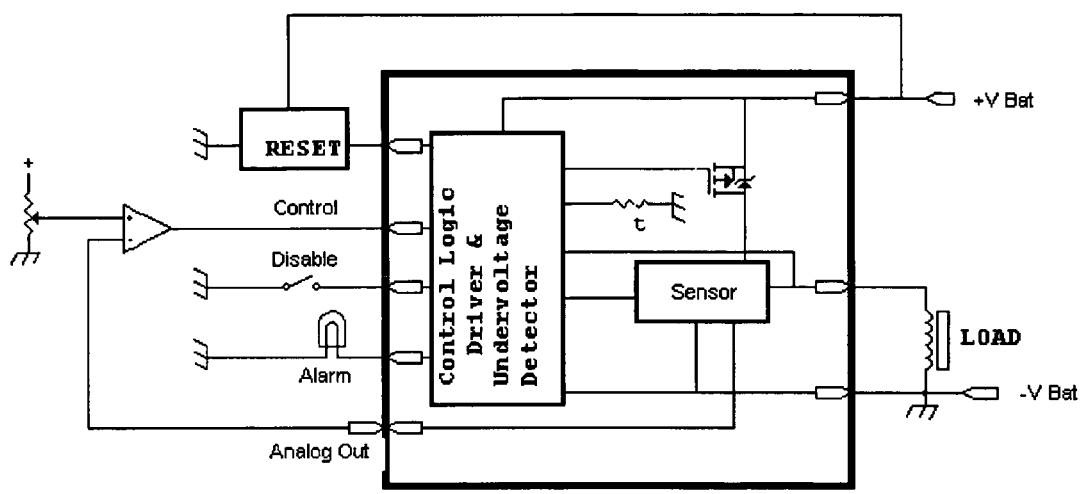
FIG. 4 shows an application of the embodiment of FIG. 1 with a variable cutoff limit.

Application of the SSSPR power control circuit is far reaching and it is useful in many industrial applications where it is required to limit bypassing current immediately or from a distance. FIG. 4. shows an example of an application where an external potentiometer is able to adjust a threshold or cut-off for the maximum allowed load current. An output analog signal, which linearly represents the bypass current, can be used for displaying actual current or for feedback control.

Intelligent Self-Protective Control Module (iSPCM)

Figure 5:
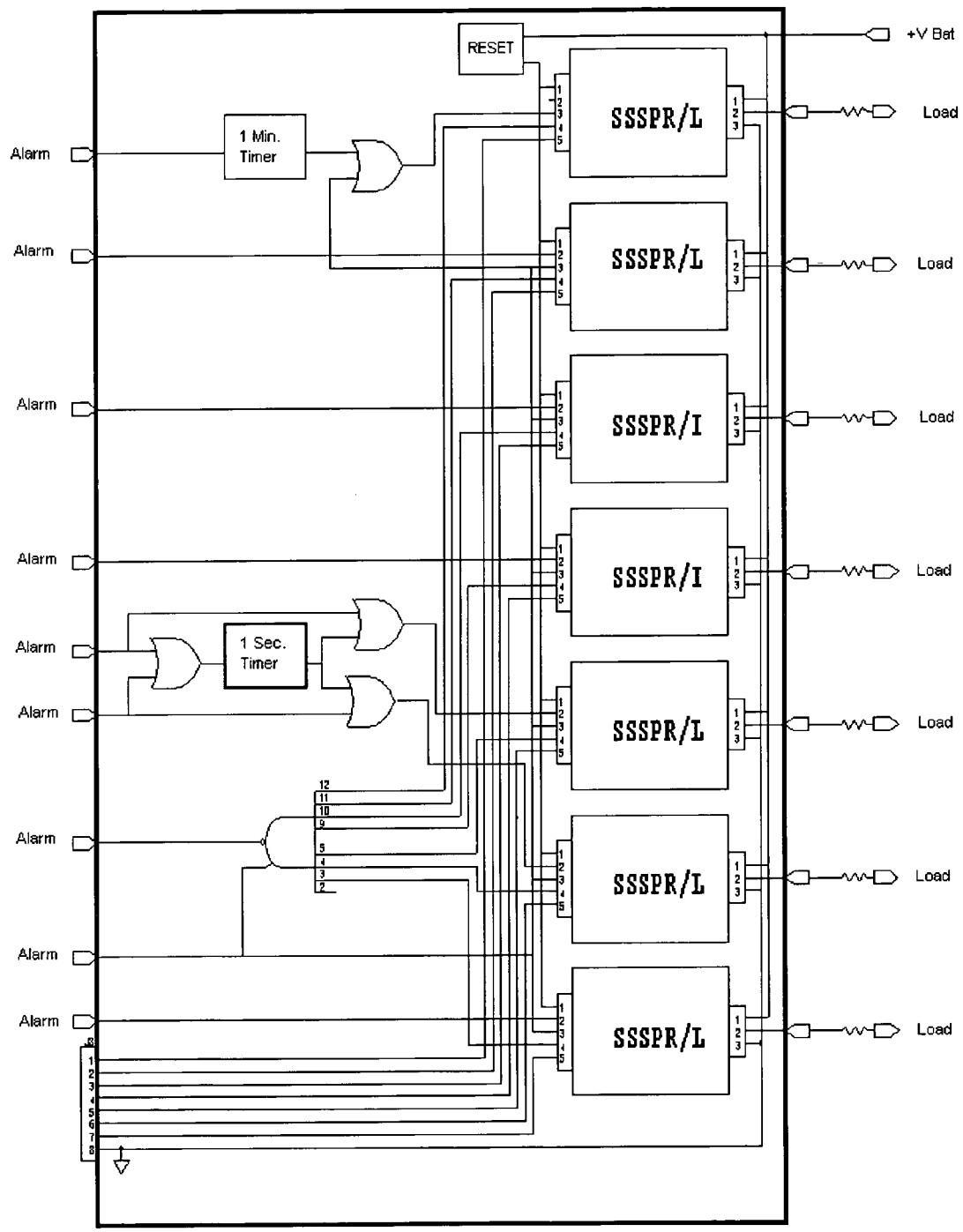
FIG. 5 shows an embodiment of a multi-channel device.

The modules shown in FIG. 1A with circuits shown in FIGS. 2-3 can be used to produce multi-channel intelligent self-protective control modules (iSPCM) that can be implemented in a variety of ways that depend on the needs of the application. FIG. 5 provides an example of an implementation of an iSPCM, which contains seven SSSPRs units. Combining several SSSPRs in a single design allows greatly simplified control, space saving and reduction in the cost of the final product. While the examples show seven SSSP units, any number of SSSPR or SSSPL units are within the scope of the present invention. In FIG. 5, the SSSPRs can be connected to work independently or semi-independently. All SSSPRs can be connected together via logic gates for performing common functions or individually. The example of FIG. 5 shows a 1 minute timer and a 1 second timer. These circuits are shown simply to aid in the understanding of the invention. They are completely optional and could be set to any time or delay units.

Application of an iSPCM for a Motorcycle

Figure 6:
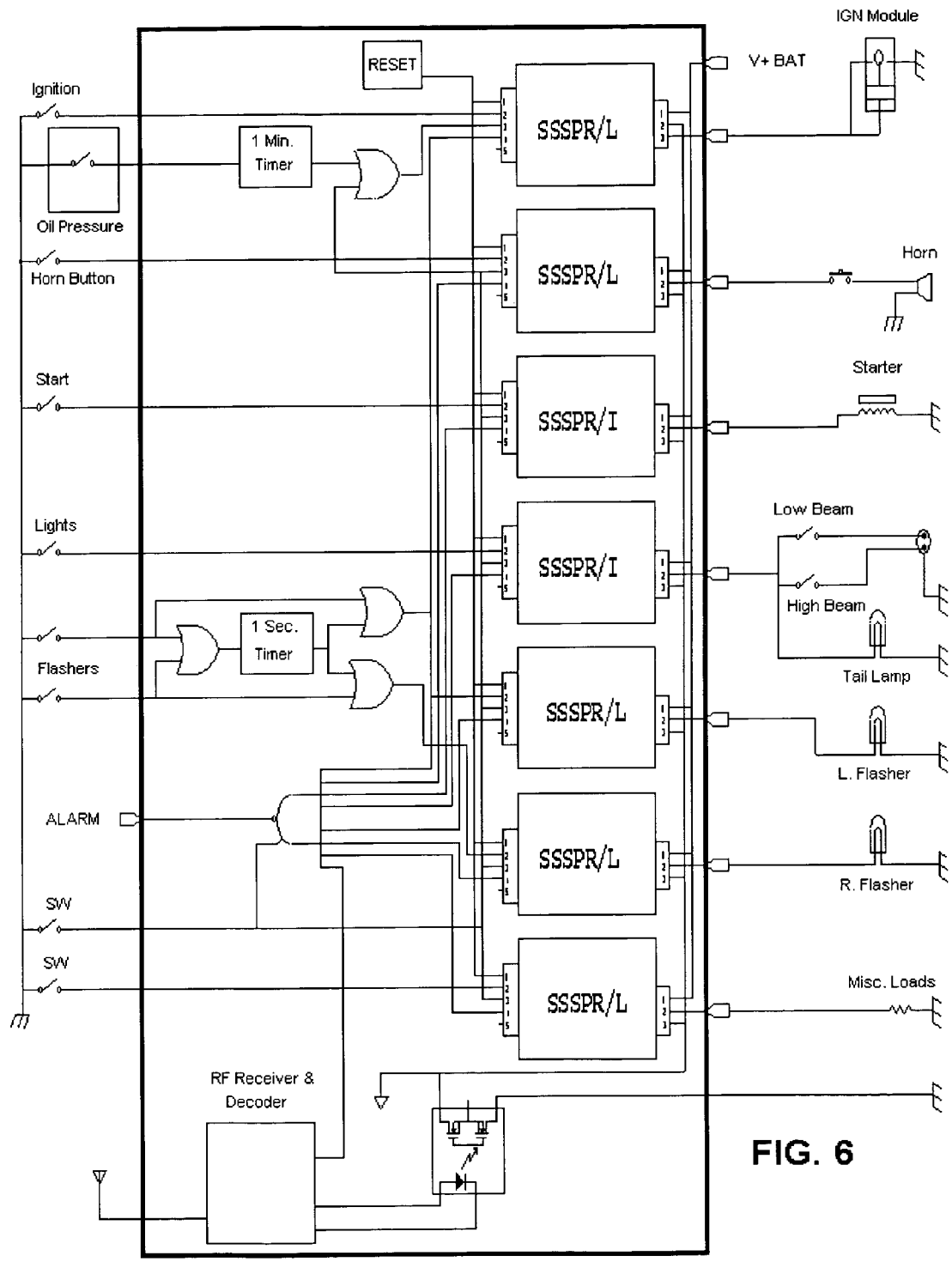
FIG. 6 shows a block diagram of an embodiment of the multi-channel device of FIG. 5 configured as a power control module for a motorcycle.

The iSPCM is useful in many industrial and consumer applications including any equipment where it is required to provide safe power to multiple auxiliary devices. FIG. 6 shows an iSPCM implemented to control power in a motorcycle. Once a coded signal via an RF communication channel reaches, and is recognized by, the RF Receiver, an enable control signal is generated and sent to turn on a dual MOSFET transistor thus providing a power to the internal devices. Shortly thereafter, an internal reset (RESET) generates a reset pulse to insure the proper state of the iSPCM. Once reset, the iSPCM is ready to accept control signals. All control signals can be activated simultaneously or in any other fashion (such as one at a time or randomly). The RF communication channel is optional, and if no remote control is desired, it can be jumpered-out or simply left out.

Each input terminal in FIG. 6 is connected to de-bouncing circuitry. While de-bouncing is optional, it is preferred for smooth functioning of the device. The de-bouncer can be built various ways known in the art. A simple design is a resistor and capacitor to ground that will integrate short pulses (spikes). The de-bouncer eliminates extra pulses that are many times generated by mechanical switches like push buttons. Bouncing is inherent problem of a mechanical device, and de-bouncing is desirable because some inputs work in a latching mode. The latching mode or a flip-flop mode is when a single input pulse is used for generating the turn-on and turn-off states sequentially. In such a mode, it is very important to receive only a single pulse for each button push. Bouncing can generate several pulses that can change the state of a flip-flop (turn-on and turn-off) several times. This is undesirable.

The power MOSFETs are controlled by a logic circuit. The logic will generate an alarm signal and turn-off of the power MOSFETs if one or all following conditions has occurred:

1. A MOSFET is bad (burned out or uncontrollable)
2. A load is absent, disconnected or bad (short or open circuit)
3. Over-current
4. Over-temperature
5. Under voltage Once the loads are connected, power from the battery can be applied to the iSPCM via an external fuse. The iSPCM protects all the loads, and no additional fuses are required. Eliminating fuses helps to save space and simplifies the wiring of a motorcycle. However, a single (common) fuse is recommended for protection against a fatal failure of the iSPCM (although this is optional). The iSPCM is ready for operation at that moment the internal logic checks the presence of the output loads and determines them to be present. The iSPCM has built-in anti-tampering protection based on the ground wire which must be connected to the battery minus or to ground. As long as the ground wire is disconnected, the iSPCM will not operate. The iSPCM of FIG. 6 will be enabled once it receives a proper enable command via the RF communication channel or by other means. Many RF receivers/decoders are available on the market and are well-known in the art. Most of them are adaptable for use with the iSPCM. A typical iSPCM can use an RF receiver/decoder based on a 32-bit shift-register with a clock recognition sequences. Optional use of the RF interface insures high security (to counter theft for example).

The iSPCM sensor input can be connected for example to an oil pressure sensor or other sensors. In a motorcycle, the contacts of the oil pressure sensor normally stay open as long as pressure is within its allowed limits. If pressure drops for any reason, the contacts close, and that signal can be used to provide, via the time-delay, a command to the logic (or CPU) to turn off the MOSFET (the time delay is necessary for starting). An output alarm can be used to drive a visual indicator (LED or a lamp) or can be applied to another device. The RF Receiver in FIG. 6 generates an enable control signal once it received a coded signal from a transmitter. The enable signal can be a toggle control. If a key-chain transmitter is activated once more, the logic can be disabled.

The circuit shown in FIG. 6 also contains a starter controller, horn controller, head and tail light controller, turn signal timer and controller and control for other miscellaneous loads and switches. An internal RESET circuit is shown based on power-on; however, it is known in the art that any type of reset can be used. A reset signal could be directly generated by the RF receiver. While an alarm output is shown in FIG. 6, this is optional. It will be understood by one skilled in the art that the circuit of FIG. 6 is just an example of a particular configuration that can be used with a motorcycle. The present invention is applicable to any power control problem in any application and particularly to the power control of all types of vehicles including, but not limited to, motorcycles, automobiles, boats, airplanes, etc. While only an oil pressure sensor is shown in FIG. 6, any type of sensor, and any number of sensors, can be used with the present invention.

Various descriptions an illustrations have been presented to aid in understanding the present invention. One skilled in the art will realize that numerous changes and variations can be made without departing from the spirit of the invention. Each of these changes and variations is within the scope of the present invention. In particular, one skilled in the art will realize that the present invention is applicable in any power control situation with any number of loads, any voltages or power supplies and any controls or inputs.

We claim:

1. A single module integrated control module comprising:
a plurality of solid-state self-protective relays, each relay having at least one input and at least one output connectable to a load external to said module, said load being switched onto or off-of a DC supply voltage by said relay;
at least one of said relays having its input directly controllable by a source external to said module;
at least one of said relays having its input timed to cause the relay to switch on and off sequentially approximately one second on, and approximately one second off;
at least one of said relays having at least one of its inputs delayed by approximately one minute;
and wherein each of said solid state self-protective relays includes:
a MOSFET power transistor, said MOSFET power transistor having an on resistance of around 20 milliohms;
a control and driver circuitry for sensing at least one input condition and turning said MOSFET power transistor on or off;
a Hall Effect sensor measuring at least a portion of current flowing through said MOSFET power transistor's load for detecting an over-current condition and notifying said control and driver circuitry of said over-current condition;
a temperature sensor in proximity to said MOSFET power transistor for providing detection of an over-temperature condition and notifying said control and driver circuitry of said over-temperature condition;
wherein said control and driver circuitry disables said MOSFET power transistor in the case of an over-current or an over-temperature condition.

2. The single module integrated control module of claim 1 further comprising a radio frequency receiver and decoder adapted to electrical connect an internal ground in said module to an external battery ground upon receipt of a particular radio signal.

3. The single module integrated control module of claim 1 further comprising at least one alarm output activated when any of said solid state self-protective relays disables.

4. The single module integrated control module of claim 1 wherein said module controls a motorcycle electrical system and has inputs selected from the group consisting of ignition, horn, start, lights, and flashers, and has outputs selected from the group consisting of IGN module, horn, starter, headlights, left flasher and right flasher.

* * * * *